United States Patent [19]

Masuzawa et al.

[11] Patent Number: 4,758,464

[45] Date of Patent: Jul. 19, 1988

[54] TRANSPARENT ELECTROCONDUCTIVE MATERIAL AND PROCESS FOR PREPARATION THEREOF

[75] Inventors: Tokihiko Masuzawa, Kani; Masatoshi Takesue, Seto; Yukio Kobayashi, Nagoya; Mitsuo Mori, Tokyo, all of Japan

[73] Assignee: Mitsubishi Rayon Co., Ltd., Tokyo, Japan

[21] Appl. No.: 906,444

[22] Filed: Sep. 12, 1986

[30] Foreign Application Priority Data

Sep. 24, 1985 [JP] Japan .................................. 60-210590
Jan. 28, 1986 [JP] Japan .................................. 61-14705

[51] Int. Cl.$^4$ ............................................. C09K 19/00
[52] U.S. Cl. ........................................ 428/220; 428/1; 428/195; 428/500; 428/697; 428/917
[58] Field of Search ................... 428/1, 195, 412, 515, 428/697, 917, 220, 500

[56] References Cited

U.S. PATENT DOCUMENTS 4,629,637 12/1986 Waldenrath ............................. 428/1

*Primary Examiner*—McCamish Marion C.

*Attorney, Agent, or Firm*—Cushman, Darby & Cushman

[57] ABSTRACT

Described is a transparent electroconductive material composed of a transparent synthetic resin substrate and a transparent electroconductive film formed on the resin substrate. At least a surface portion of the resin substrate on which the electroconductive film is formed satisfies a requirement represented by the formula: F x Hv=0.4 wherein F is the mole number ($\mu$mole/cm$^2$) of a basic dye that can react with or adhere to the unit area of the surface of the synthetic resin, and Hv is the Vickers hardness as determined according to JIS Z-2244. The absolute value of the photoelasticity constant of the resin substrate below the glass transition temperature thereof is not larger than 15 Brewsters. A preferred transparent electroconductive material is prepared by coating an active energy ray-curing composition satisfying a requirement represented by the above formula on a surface of the transparent synthetic resin substrate having the above-mentioned absolute value of the photoelasticity constant; curing the composition with active energy rays; and forming a transparent electroconductive film on the coating layer by a low-temperature sputtering method at a temperature lower than 100° C.

4 Claims, No Drawings

TRANSPARENT ELECTROCONDUCTIVE MATERIAL AND PROCESS FOR PREPARATION THEREOF

BACKGROUND OF THE INVENTION

1. Field of the Invention

The present invention relates to a transparent electroconductive material which comprises a substrate of a synthetic resin and a transparent electroconductive film formed thereon, wherein an excellent adhesion exists between the transparent electroconductive film and the substrate, and a process for the preparation of this transparent electroconductive material.

2. Description of the Prior Art

A transparent electroconductive substrate is widely used as an electrode of a liquid crystal display device or electroluminescence emitter, a transparent face heat generator, a touch panel switch, an electrostatic screening material, an antistatic material and the like.

Conventional transparent electroconductive substrates are composed mainly of glass, and recently, a transparent electroconductive substrate comprising a substrate composed of a heat-resistant polymer film such as a polyester or polyimide film and a film of a metal such as gold, palladium or aluminum or a indium-tin oxide semiconductor film coated on the substrate, has been proposed.

An electroconductive substrate composed of glass has an excellent transparency and electroconductivity but exhibits poor flexibility, impact resistance and processability, and there is little reduction in the weight, which is important for practical utilization.

An electroconductive material having a plastic substrate exhibits excellent processability, impact resistance, and light weight characteristics, but the transparency of the substrate per se is lower than that of glass, and hence, a thick material such as a plate can not be practically used in fields where a high transparency is required. More specifically, a practically applicable substrate of this type is limited to a filmy product having a thickness of up to several hundred microns. For example, when polyethylene terephthalate is used as the substrate, if the quantity of deformation by an external stress is about 5 to about 30%, a large change of about $50 \times 10^{-3}$ to about $100 \times 10^{-3}$ is caused in the optical birefringence, resulting in a reduction of the transmittance and in optical distortion. Therefore, the thickness must be reduced to avoid these disadvantages. Furthermore, since the optical distortion is large, as mentioned above, where the substrate is used as an electrode of a liquid crystal display device or the like, even if the film thickness is reduced, a uniform image cannot be obtained.

Moreover, the adhesion of the plastic substrate to a transparent electroconductive film which is composed of an inorganic material is poor. Methods for improving the adhesion between the transparent electroconductive film and the organic substrate have been proposed in Japanese Unexamined Patent Publications No. 55-36280 and No. 56-10450. But, even according to these methods, it is impossible to obtain a transparent electroconductive substrate having a large substrate thickness, a small optical distortion, and an excellent transparency.

SUMMARY OF THE INVENTION

It is therefore a primary object of the present invention to provide a transparent electroconductive material which has a small optical distortion and a high transparency even if a thick plastic substrate, processability, impact resistance and adhesion between a transparent electroconductive film and a plastic substrate.

In accordance with one aspect of the present invention, there is provided a transparent electroconductive material which comprises a substrate of a transparent synthetic resin and a transparent electroconductive film formed on the transparent synthetic resin substrate, at least a surface portion of the substrate satisfying a requirement represented by the following formula (1):

$$F \times Hv \geq 0.4 \tag{1}$$

wherein F stands for the mole number ($\mu$mole/cm$^2$) of a basic dye that can react with or adhere to the unit area of the surface of the transparent synthetic resin, and Hv stands for the Vickers hardness as determined according to the method of JIS Z-2244, and the absolute value of the photoelasticity constant of the transparent synthetic resin substrate below the glass transition temperature thereof being not larger than 15 Brewsters.

A transparent electroconductive film may be directly formed on a transparent synthetic resin substrate satisfying the requirement of the formula (1), or a transparent electroconductive film may be formed on a coating layer of a synthetic resin satisfying the requirement of the formula (1), which is formed on a transparent synthetic resin substrate.

In accordance with another aspect of the present invention, there is provided a process for the preparation of a transparent electroconductive material which comprises coating an active energy ray-curing type composition satisfying the requirement of the formula (1) on the surface of a transparent synthetic resin substrate having an absolute value of the photoelasticity constant below the glass transition temperature of not larger than 15 Brewsters, curing the coated composition with active energy rays to form a cured coating layer, and forming a transparent electroconductive film on the coating layer by a low-temperature sputtering method at a temperature not higher than 100° C.

DESCRIPTION OF THE PREFERRED EMBODIMENTS

In the above-mentioned formula (1), the mole number F ($\mu$mole/cm$^2$) of a basic dye that can react with or adhere to the unit area of the surface of the transparent synthetic resin is a value determined according to the following method.

(1) A 0.1N buffer solution of sodium acetate (having a pH value of 4.5) is prepared.

(2) A solution of Methyl Violet Special having a concentration of 1.0 g/l is prepared by using the solution (1).

(3) A synthetic resin substrate having a size of 50 mm×50 mm is immersed in the solution for 48 to 72 hours.

(4) The substrate is washed with water.

(5) The substrate is washed for about 30 seconds in 99% ethanol.

(6) The substrate is washed with water again.

(7) Water is wiped from the substrate.

(8) The adsorbance of the substrate is measured by using light having a wavelength of 580 nm.

(9) Separately, a calibration curve of the dye concentration is prepared from dye solutions. The concentration of the basic dye per unit area of one surface of the substrate is calculated.

The transparent synthetic resin substrate used in the present invention is not particularly critical, so far as at least the surface portion thereof satisfies the requirement of the formula (1), and the absolute value of the photoelasticity constant of the transparent synthetic resin below the glass transition point (Tg) thereof is not more than 15 Brewsters. The "photoelasticity constant" referred to herein is a criterion indicating the ease of occurrence of the stress birefringence by the difference of the main stress, and one brewster is equal to $10^{-13}$ dyn/cm². The reason why it is essential that the absolute value of this photoelasticity constant be less than 15 brewsters is that as the birefringence becomes large, deviations of the transmitted light in the longitudinal and lateral directions are caused and an image is seen to flicker. When the synthetic resin substrate is used as an electrode for a liquid crystal display device, this flickering is emphasized by a polarizing plate used for liquid crystal display, density unevenness is brought about, and coloration shifts to the tone reduction side or the tone addition side according to whether the birefringence is a negative value or a positive value, resulting in color unevenness. Furthermore, the stress birefringence is greatly changed according to the temperature, but from the practical viewpoint, it is sufficient if the above requirement is satisfied at a temperature lower than the glass transition temperature.

The synthetic resin substrate has a certain optical birefringence which depends upon the composition, crystallinity, and orientation state. Ordinarily, a substrate having a large absolute value of the photoelasticity constant has a larger optical birefringence.

Moreover, in the synthetic resin substrate, various stress distortions are generated at the time of molding, such as inflation molding, injection molding, polymerization molding or compression molding, and therefore, a stress birefringence is generated in the molded and processed synthetic resin substrate.

Accordingly, if a synthetic resin substrate having a large absolute value of the photoelasticity constant is used, a problem of flickering of the transmitted light arises, and this problem is especially serious in the case of a thick substrate.

Even where a thin substrate is used, for example, as an electrode for liquid crystal display, since a polarizing plate is used in this application field, color unevenness is caused when a synthetic resin substrate having a large absolute value of the photoelasticity constant is used.

As specific examples of the synthetic resin substrate used in the present invention, there can be mentioned a methacrylic polymer obtained from methylmethacrylate or a monomer mixture comprising methyl methacrylate as a main component, a polycarbonate, static polystyrene, static poly (α-methylstyrene), and amorphous isotactic polystyrene. Among these polymers, a methacrylic polymer is preferred from the viewpoint of the absolute value of the photoelasticity constant and transparency. Where a coating layer satisfying the requirement of the formula (1) is formed on the surface of the substrate, poly (methyl methacrylate) is especially preferred among methacrylic polymers. Where a transparent electroconductive film is directly formed, poly (methyl methacrylate) cannot be used because the polymer fails to satisfy the requirement of formula (1). As preferred examples of the methacrylic polymer used in the latter case, there can be mentioned acrylic resins composed mainly of methyl methacrylate and obtained by copolymerization with esters of acrylic acid or methacrylic acid and with a diol such as ethylene glycol or 1,3-propane-diol, a triol such as trimethylolethane or trimethylolpropane or other polyol. Acrylic resins of this type may further comprise, as a third component, an ester of acrylic acid or methacrylic acid with a monohydric alcohol such as propanol or butanol. Where a coating layer satisfying the requirement of formula (1) is formed on the surface of the substrate, if a high heat resistance is required, a polycarbonate is preferably used.

In the present invention, the use of resins in which the absolute value of the photoelasticity at a temperature lower the glass transition point (Tg) is larger than 15 brewsters, such as polyethylene terephthalate, a phenolic resin, an epoxy resin, gelatin, a diallyl phthalate resin, and a polyimide should be avoided.

The thickness of the synthetic resin substrate is not particularly critical, but if the thickness is larger than 0.3 mm, a rigidity can be imparted to the substrate and the characteristics of the present invention are especially effectively manifested. Accordingly, it is preferred that the thickness of the synthetic resin substrate be larger than 0.3 mm.

At least the surface portion of the transparent synthetic resin substrate should satisfy the requirement of formula (1). If a transparent synthetic resin substrate in which the F×Hv value of the surface is smaller than 0.4 is used, a practically sufficient adhesion cannot be obtained. The upper limit of the F×Hv value is not particularly critical, but the upper limit is ordinarily 5.

The reason why an excellent adhesion is attained between the transparent electroconductive film and the substrate if the F×Hv value is 0.4 or larger has not been elucidated, but it is presumed that if the substrate has a sufficient hardness, an anchoring effect if produced between the transparent electroconductive film and the substrate, and if some functional groups or coordination sites with or to which a basic dye reacts or adheres are present on the surface of the synthetic resin substrate, atoms or atomic groups constituting the transparent electroconductive film coordinate with these sites, whereby an adhesive force is produced due to the coordination effect.

Where a transparent synthetic resin substrate satisfying the requirement of formula (1) is used, a transparent electroconductive film can be directly formed on the surface of this substrate, but where a transparent synthetic resin substrate not satisfying the requirement of formula (1) is used, a synthetic resin coating satisfying the requirement of formula (1) is formed on the surface of the substrate and a transparent electroconductive film is formed on the coating layer. Any of synthetic resins satisfying the requirement of formula (1) can be used without any particular limitation as the synthetic resin for forming the coating layer satisfying the requirement of formula (1). But, a polymer obtained by polymerizing a monomer mixture comprising 30 to 98% by weight of a polyfunctional monomer having at least three acryloyl and/or methacryloyl groups in the molecule and 70 to 2% by weight of a monomer having one or two acryloyl and/or methacryloyl groups in the molecule is preferred.

The polymerization process for obtaining the coating layer is not particularly critical, if polymerization can be carried out at a low temperature (lower than 100° C.). But, a polymerization process using active energy rays such as ultraviolet rays, electron beams or radioactive rays is preferred. A photosensitizer can be added to the monomers for the formation of a coating layer according to need.

In view of the adhesion between the synthetic resin substrate and the coating layer, and the smoothness, it is preferred to use a polymer obtained by polymerizing an active energy-curing composition comprising 5 to 90 parts by weight of the above-mentioned monomer mixture, 95 to 10 parts by weight of an organic solvent capable of dissolving the above-mentioned monomer mixture therein and 0 to 10 parts by weight of a photosensitizer.

The thickness of the coating layer is not particularly critical, but it is preferred that the thickness of the coating layer by about 2 to about 40 μm.

It is preferred that the surface resistivity of the transparent electroconductive film in the present invention be $10^{-1}$ to $10^9 \Omega/\square$. If the transparent electroconductive film has a surface resistivity higher than $10^9 \Omega/\square$, good results are not obtained with respect to the electroconductivity and antistatic effect. A metal film and a metal oxide film can be used as the transparent electroconductive film. But, a metal oxide film is preferable because a metal film has large reflection and absorption of light and an inferior substantial transparency.

As the metal oxide film, there can be mentioned a indium oxide/tin oxide film, a tin oxide/antimony oxide film, a cadmium oxide/tin oxide film, and a zinc oxide film. As the metal film, there can be mentioned, for example, a gold film, a palladium film, a chromium alloy film, and an aluminum film. In view of the etching property, light transmittance, and surface resistivity, an indium oxide/tin oxide film is preferred. Where an oxidation resistance is required, a tin oxide/antimony oxide film is preferably used. The transparent electroconductive film may be a multi-layer film comprising such metal oxide and/or metal films.

In the present invention, since a synthetic resin is used as the substrate, a sputtering method conducted at a temperature lower than 100° C. is preferably adopted for forming the transparent electroconductive film.

In the transparent electroconductive material of the present invention, a higher visibility is preferred, and the total light transmission should be at least 40%, preferably at least 75%, especially preferably at least 85%.

The transparent electroconductive material of the present invention has an excellent processability and impact resistance, and the adhesion between the transparent electroconductive film and the synthetic resin substrate is very high. Accordingly, the transparent electroconductive material of the present invention is valuable for use as electrodes of elements of a liquid crystal display, electroluminescence and plasma display, for devices used in the field where a light transmitting property in the visibly region required, such as a transparent face heat generator, and as a touch panel switch, an electrostatic screen material, an antistatic material and the like.

The present invention will now be described in detail with reference to the following examples. In the examples, the physical properties were determined and evaluated according to the following methods.

(1) Mole number F of basic dye that can react with or adhere to unit area of surface of transparent synthetic resin The mole number F was determined according to the method described hereinbefore.

(2) Vickers hardness

The Vickers hardness was determined according to the method of JIS Z-2244.

(3) Photoelasticity constant

The photoelasticity constant does not depend on the thinkness of the substrate. Accordingly, a disc having a thickness of 2 mm and a diameter of 50 mm was used as a sample. A load of 5 kg was imposed in the direction of the diameter, and monochromatic parallel rays of 5461 Å were applied in the direction normal to the disc surface. At this time, a light source, a polarizer, the sample, an analyzer, and a camera were set, in this order, and an isochromatic dark-bright fringe generated by the birefringence was photographed and the photoelasticity constant calculated according to the following equation:

$$C = \frac{\pi D_n \lambda}{8P \times 0.980 \times 10^4}$$

wherein c stands for the photoelasticity constant (dyn/cm²), D stands for the diameter (mm) of the sample disc, n designates the line number of the isochromatic dark-bright fringe, λ stands for the wavelength (Å) of light used for the measurement, and P stands for the load (kg).

Note, $0.980 \times 10^4$ is a coefficient determined while taking the unit into consideration.

(4) Adhesion

The adhesion was determined according to the cross-cut adhesive cellophane tape peel test. Eleven cut lines extending to the substrate were formed in the transparent electroconductive layers at intervals of 1 mm along each of the longitudinal and lateral directions to form 100 cut squares having an area of 1 mm². A commercially available adhesive tape was pressed onto the transparent electroconductive layers, and the tape was strongly peeled upward. The adhesion was evaluated according to the following scale.

Class 5: no cut square peeled
Class 4: 1 to 24 cut squares peeled
Class 3: 25 to 49 cut squares peeled
Class 2: 50 to 74 cut squares peeled
Class 1: at least 75 cut squares peeled (5) Surface resistivity The surface resistance value was measured according to the customary four-probe measuring method.

(6) Total light transmission

The total light transmission was measured according to ASTM D-1003 (visible region).

(7) Optical distortion

Two polarizing plates were arranged on a Cross Nicol prism and the sample was introduced between the polarizing plates. Sun light (white light) was applied, and in an area of a brightest light, the color difference generated by the reduction or addition of color was observed.

A: no substantial color difference
B: slight color difference
C: apparent color difference Example 1

A poly(methyl methacrylate) plate having a thickness of 2 mm was immersed in a coating layer-forming monomer mixture solution comprising 8 parts by weight of pentaerythritol tetraacrylate, 20 parts by weight of trimethylolpropane triacrylate, 12 parts by weight of 1,4-butane-diol diacrylate, 60 parts by weight of isopropanol and 2 parts by weight of benzoin isobutyl ether, and the plate was gradually pulled up at a speed of 0.5 cm/sec to form a coating film of the solution on the surface of the resin plate. The resin plate was placed in a quartz cylinder maintained at 40° C., through which nitrogen gas was circulated, and the resin plate was kept in the cylinder for 3 minutes. Then, in this state, the resin plate was irradiated with rays emitted from high-pressure mercury lamps (100W) located above and below the resin plate at distances of 20 cm for 10 minutes to form a coating layer having a thickness of 6 μm. High-frequency magnetron sputtering was conducted on the poly(methyl methacrylate) resin plate having the coating layer formed thereon, in an argon atmosphere (3 mTorr) containing 3% of oxygen at 60° C. by using indium oxide/tin oxide (95/5 weight ratio) as a target to obtain a transparent electroconductive substrate having a transparent electroconductive film of indium oxide/tin oxide having a thickness of 800 Å. The results of evaluation of the obtained substrate are shown in Table 1.

Example 2

A transparent electroconductive substrate was prepared in the same manner as described in Example 1 except that a polycarbonate plate having a thickness of 1 mm was used as the resin plate. The obtained results are shown in Table 1.

Examples 3 through 5

A transparent electroconductive substrate was prepared in the same manner as described in Example 1 except that a poly(methyl methacrylate) plate having a thickness of 0.1, 0.3 or 5 mm was used as the resin plate. The obtained results are shown in Table 1.

Comparative Examples 1 through 6

Electroconductive substrates were prepared in the same manner as described in Example 1 except that a polyethylene terephthalate plate having a thickness of 1 mm, a polyimide plate having a thickness of 1 mm, an epoxy resin plate having a thickness of 1 mm, a phenolic resin plate having a thickness of 1 mm, a diallyl phthalate resin plate having a thickness of 1 mm and a polyethylene terephthalate plate having a thickness of 0.3 mm were used. The obtained results are shown in Table 1.

TABLE 1

| | Substrate | Thickness of substrate (mm) | Thickness of coating layer (μm) | Absolute value of photo-elasticity constant (Brewster) | FxHv | Thickness of transparent electro-conductive film (Å) | Surface resistivity (Ω/□) | Total light transmission (%) | Adhesion (Class) | Optical distortion |
|---|---|---|---|---|---|---|---|---|---|---|
| Example 1 | PMMA | 2 | 6 | 4 | 1.42 | 800 | 80 | 87 | 5 | A |
| Example 2 | PC | 1 | 6 | 13 | 1.41 | 800 | 80 | 85 | 5 | B |
| Example 3 | PMMA | 0.1 | 6 | 4 | 1.42 | 800 | 80 | 88 | 5 | A |
| Example 4 | PMMA | 0.3 | 6 | 4 | 1.43 | 800 | 80 | 87 | 5 | A |
| Example 5 | PMMA | 5 | 6 | 4 | 1.42 | 800 | 80 | 87 | 5 | A |
| Comparative Example 1 | PET | 1 | 6 | 88 | 1.38 | 800 | 70 | 78 | 5 | C |
| Comparative Example 2 | Polyimide | 1 | 6 | 38 | 1.40 | 800 | 80 | 19 | 5 | C |
| Comparative Example 3 | Epoxy resin | 1 | 6 | 50 | 1.15 | 800 | 90 | 32 | 5 | C |
| Comparative Example 4 | Phenolic resin | 1 | 6 | 50 | 1.38 | 800 | 90 | 20 | 5 | C |
| Comparative Example 5 | Diallyl phthalate resin | 1 | 6 | 42 | 1.42 | 800 | 80 | 38 | 5 | C |
| Comparative Example 6 | PET | 0.3 | 6 | 88 | 1.32 | 800 | 90 | 82 | 5 | C |

Note
PMMA: poly(methyl methacrylate)
PC: polycarbonate
PET: polyethylene terephthalate Example 6

A poly(methyl methacrylate) resin plate having a thickness of 3 mm was immersed in a coating layer-forming polymer mixture solution comprising 20 parts by weight of ethylene glycol diacrylate, 80 parts by weight of methyl methacrylate, and 1 part by weight of benzoin isobutyl ether, and the resin plate was gradually pulled up at a speed of 0.8 cm/sec to form a coating film of the solution on the surface of the solution. The resin plate was maintained at 40° C. for 3 minutes, and the resin plate was irradiated with rays emitted from high-pressure mercury lamps (100W) located below and above the resin plate at distances of 20 cm in air for 7 minutes to form a coating layer.

In the same manner as described in Example 1, an indium oxide/tin oxide film having a thickness of 300 Å was formed on the coating layer to obtain a transparent electroconductive substrate.

The results of evaluation of the obtained substrate are shown in Table 2.

Example 7

The procedures of Example 6 were repeated in the same manner except that a mixture of 33 parts by weight of ethylene glycol diacrylate and 67 parts by weight of methyl methacrylate was used as the coating layer-forming monomer mixture. The obtained results are shown in Table 2.

Example 8

The procedures of Example 6 were repeated in the same manner except that a mixture of 20 parts by weight 1,6-hexane-diol diacrylate and 80 parts by weight of methyl methacrylate was used as the coating layer-forming monomer mixture. The obtained results are shown in Table 2.

Comparative Example 1

An indium oxide/tin oxide film having a thickness of 300 Å was prepared on a poly(methyl methacrylate) resin plate in the same manner as described in Example 7 except that the coating layer was not formed on the poly(methyl methacrylate) resin plate. The obtained results are shown in Table 2.

Comparative Example 2

The procedures of Example 6 were repeated in the same manner except that a monomer mixture comprising 10 parts by weight of ethylene glycol diacrylate and 90 parts by weight of methyl methacrylate was used as the coating layer-forming monomer mixture, and an indium oxide/tin oxide film having a thickness of 1300 Å was formed on the coating layer. The obtained results are shown in Table 2.

and the coating layer was maintained at 40° C. for 3 minutes and cured by using a mercury lamp (200W) located at a distance of 13 cm. The coated film was pressed on a poly(methyl methacrylate) resin plate having a thickness of 2 mm, and the polyester film was peeled to obtain a coating layer having a thickness of 20 μm on the resin plate. In the same manner as described in Example 1, an indium oxide/tin oxide film having a thickness of 2600 Å was formed on the resin plate having the coating layer formed thereon. The obtained results are shown in Table 4.

Example 14

A poly(methyl methacrylate) resin plate having a thickness of 2 mm was immersed in a coating layer-forming monomer mixture solution comprising 16 parts by weight of pentaerythritol hexa-acrylate, 10 parts by weight of trimethylolethane diacrylate, 8 parts by

TABLE 2

| | Substrate | Thickness of substrate (mm) | Composition of coating layer | Thickness of coating Layer (μm) | Absolute valve of photo-elasticity constant (Brewster) | FxHv | Thickness of transparent electro-conductive (Å) | Surface Resistivity (Ω/□) | Total light transmission (%) | Adhesion (Class) | Optical distortion |
|---|---|---|---|---|---|---|---|---|---|---|---|
| Example 6 | PMMA | 3.0 | EDA/MMA = 20/80 | 4 | 4 | 0.41 | 300 | 300 | 88 | 4 | A |
| Example 7 | PMMA | 3.0 | EDA/MMA = 33/67 | 5 | 4 | 0.77 | 300 | 300 | 88 | 4-5 | A |
| Example 8 | PMMA | 3.0 | HDA/MMA = 20/80 | 5 | 4 | 0.66 | 300 | 300 | 89 | 4-5 | A |
| Comparative Example 1 | PMMA | 3.0 | — | — | 4 | 0.13 | 300 | 500 | 90 | 1 | A |
| Comparative Example 2 | PMMA | 3.0 | EDA/MMA = 10/90 | 4 | 4 | 0.29 | 1300 | 40 | 87 | 2 | A |

Note
Transparent electroconductive film: indium oxide/tin oxide
EDA: ethylene glycol diacrylate
MMA: methyl methacrylate
HDA: 1,6-hexane-diol diacrylate

Examples 9 through 12

The procedures of Example 1 were repeated in the same manner except that a transparent electroconductive film having a thickness of 1300 Å was prepared by using indium oxide/tin oxide, tin oxide/antimony oxide, cadmium oxide/tin oxide or zinc oxide as the sputtering target. The obtained results are shown in Table 3.

weight of tetrahydrofurfuryl acrylate, 65 parts by weight of a 1:1 mixture of isopropanol and toluene, and 1 part by weight of benzoin butyl ether, and the resin plate was gradually pulled out at a speed of 0.5 cm/sec to form a coating film on the surface of the resin plate. The resin plate was allowed to stand for 5 minutes and was irradiated with rays emitted from high-pressure mercury lamps (2 KW) located above and below the

TABLE 3

| | Substrate | Thickness of substrate (mm) | Thickness of coating layer (μm) | Absolute value of photo-elasticity constant (Brewster) | FxHv | Kind of transparent electroconductive film | Thickness of transparent electro-conductive film (Å) | Surface resistivity (Ω/□) | Total light transmission (%) | Adhesion (Class) | Optical distortion |
|---|---|---|---|---|---|---|---|---|---|---|---|
| Example 9 | PMMA | 2.0 | 6 | 4 | 1.42 | Indium oxide/tin oxide | 1300 | 40 | 90 | 5 | A |
| Example 10 | PMMA | 2.0 | 6 | 4 | 1.42 | Tin oxide/antimony oxide | 1300 | 100 | 83 | 5 | A |
| Example 11 | PMMA | 2.0 | 6 | 4 | 1.42 | Cadmium oxide/tin oxide | 1300 | 90 | 81 | 5 | A |
| Example 12 | PMMA | 2.0 | 6 | 4 | 1.42 | Zinc oxide | 1300 | $10^3$ | 84 | 5 | A |

Example 13

A coating layer-forming monomer mixture solution comprising 16 parts by weight of dipentaerythritol hexa-acrylate, 16 parts by weight of trimethylolethane diacrylate, 65 parts of a 1:1 mixture of isopropanol and toluene, and 3 parts by weight of benzoin butyl ether was coated in a thickness of 40 μm on a polyester film, resin plate located at distances of 15 cm in air for 10 seconds to obtain a coating layer having a thickness of 4 μm. In the same manner as described in Example 1, an indium oxide/tin oxide film having a thickness of 2600 Å was formed on the poly(methyl methacrylate) resin plate having the coating layer formed thereon. The obtained results are shown in Table 4.

TABLE 4

| | Substrate | Thickness of substrate (mm) | Thickness of coating layer (μm) | Absolute value of photo-elasticity constant (Brewster) | FxHv | Thickness of transparent electro-conductive film (Å) | Surface resistivity (Ω/□) | Total light transmission (%) | Adhesion (Class) | Optical distortion |
|---|---|---|---|---|---|---|---|---|---|---|
| Example 13 | PMMA | 2 | 20 | 4 | 1.78 | 2600 | 20 | 86 | 5 | A |
| Example 14 | PMMA | 2 | 4 | 4 | 2.09 | 2600 | 20 | 86 | 5 | A |

Example 15

A composition comprising 20 parts by weight of ethylene glycol diacrylate, 80 parts by weight of methyl methacrylate, and 0.05 part by weight of benzoyl peroxide was polymerized at 60° C. to obtain a transparent plate having a thickness of 3 mm. High-frequency magnetron sputtering was carried out on the transparent plate in an argon atmosphere (3 mTorr) containing 3% of oxygen at 0° C. by using indium oxide/tin oxide (95/5) as a target to obtain a transparent electroconductive material having an indium oxide/tin oxide film of 300 Å formed thereon. The results of evaluation of the transparent electroconductive material are shown in Table 5.

Example 16

A transparent electroconductive material was prepared in the same manner as described in Example 15 except that a transparent plate was prepared from a mixture comprising 33 parts by weight of ethylene glycol diacrylate, 67 parts by weight of methyl methacrylate, and 0.05 part by weight of benzoyl peroxide. The evaluation results are shown in Table 5.

Example 17

A transparent electroconductive material was prepared in the same manner as described in Example 15 except that a transparent plate was prepared from a monomer mixture comprising 20 parts by weight of 1,6-hexane-diol diacrylate, 80 parts by weight of methyl methacrylate, and 0.05 part by weight of benzoyl peroxide. The evaluation results are shown in Table 5.

Comparative Example 3

In the same manner as described in Example 15, an indium oxide/tin oxide film was formed on a commercially available poly(methyl methacrylate) plate (2 mm in thickness; Acrylite L supplied by Mitsubishi Rayon Co.). The results of evaluation of the resulting transparent electroconductive material are shown in Table 5.

Comparative Example 4

A transparent electroconductive material was prepared by forming an indium oxide/tin oxide film on a vinyl chloride film (0.2 mm in thickness) in the same manner as described in Example 15. The evaluation results are shown in Table 5.

TABLE 5

| | Substrate | Thickness (mm) | F | Hv | FxH | Photo-elasticity constant | Surface resistivity (Ω/□) | Transmission (%) | Adhesion | Optical distortion |
|---|---|---|---|---|---|---|---|---|---|---|
| Example 15 | EDA/MMA = ¼ | 3 | 0.017 | 23.9 | 0.41 | 4 | 500 | 89 | 5 | A |
| Example 16 | EDA/MMA = ½ | 3 | 0.034 | 22.5 | 0.77 | 4 | 500 | 89 | 5 | A |
| Example 17 | HDA/MMA = ¼ | 3 | 0.037 | 17.8 | 0.66 | 4 | 500 | 89 | 5 | A |
| Comparative Example 3 | PMMA | 2 | 0.006 | 22.4 | 0.13 | 4 | 500 | 89 | 1 | A |
| Comparative Example 4 | PVC | 0.2 | 0.020 | 13.2 | 0.27 | — | 500 | 72 | 1 | C |

Note
EDA: ethylene glycol diacrylate
HDA: 1,6-hexane-diol diacrylate

We claim:

1. A transparent electroconductive material comprising a substrate of transparent synthetic resin with a thickness of at least 0.3 mm and a transparent electroconductive film formed directly on the transparent synthetic resin substrate, said transparent synthetic resin being a methyl methacrylate copolymer derived from a monomer mixture comprising methyl methacrylate and at least one comonomer selected from the group consisting of an ester of acrylic acid with an alkylene diol and an ester of methacrylic acid with an alkylene diol and said transparent synthetic resin substrate satisfying a requirement represented by the following formula (1):

$$F \times Hv \geq 0.4 \qquad (1)$$

wherein

F stands for the mole number (μmole/cm²) of a basic dye that can react with or adhere to the unit area of the surface of the transparent synthetic resin, and Hv stands for the Vickers hardness as determined according to the method of JIS Z-2244, and the absolute value of the photoelastic resin substrate below the glass transition temperature thereof being not large than 15 Brewsters.

2. The transparent electroconductive material according to claim 1, wherein the transparent electroconductive film is formed of a metal oxide having a surface resistivity of $10^{-1}$ to $10^9$ Ω/□.

3. The transparent electroconductive material according to claim 2 wherein the metal oxide is a mixture of indium oxide and tin oxide.

4. The transparent electroconductive material according to claim 2, wherein the metal oxide is a mixture of tin oxide and antimony oxide.

* * * * *